United States Patent [19]
Tew et al.

[11] Patent Number: 5,705,299
[45] Date of Patent: Jan. 6, 1998

[54] LARGE DIE PHOTOLITHOGRAPHY

[75] Inventors: Claude E. Tew, Dallas; Frank J. Poradish, Plano, both of Tex.

[73] Assignee: Texas Instruments Incorporated, Dallas, Tex.

[21] Appl. No.: 990,992

[22] Filed: Dec. 16, 1992

[51] Int. Cl.[6] ................................................ G03F 9/00
[52] U.S. Cl. ........................ 430/5; 430/22; 430/321
[58] Field of Search ............................ 430/5, 22, 312, 430/321

[56] References Cited

U.S. PATENT DOCUMENTS

| 4,869,998 | 9/1989 | Eccles et al. | 430/5 |
| 5,227,269 | 7/1993 | Scott | 430/5 |

FOREIGN PATENT DOCUMENTS 56-12644  2/1981  Japan.

OTHER PUBLICATIONS

Holbrook, et al. "Microlithography for Large Area Flat Panel Display Substrates," *Solid State Technology*, May 1992, vol. 35, No. 5.

*Primary Examiner*—S. Rosasco
*Attorney, Agent, or Firm*—Julie L. Reed; James C. Kesterson; Richard L. Donaldson

[57] ABSTRACT

An improved reticle (20) and method of using it to expose layers of wafers for large integrated circuits (10). The integrated circuit (10) is designed so that nonrepeating patterns are laid out in perimeter areas, distinct from the center area containing contiguous repeating patterns. The reticle (20) is patterned with multiple masks (21–23), with different masks representing the repeating and nonrepeating patterns. The mask (22) representing the repeating pattern may then be stepped and illuminated separately from any mask (21, 23) representing a nonrepeating pattern.

12 Claims, 1 Drawing Sheet

LARGE DIE PHOTOLITHOGRAPHY

TECHNICAL FIELD OF THE INVENTION

This invention relates to integrated electronic circuits, and more particularly to fabricating devices having repeatable patterns.

BACKGROUND OF THE INVENTION

Fabrication of integrated circuits requires precisely controlled sizing of areas to be doped, etched, or otherwise processed. Photolithographic techniques are often used for defining these areas. That is, a photoresist layer is first applied to a substrate, and then exposed through a mask. The mask contains clear and opaque features that define the pattern to be created in the photoresist layer. The areas in the photoresist that are exposed to light, or other radiation, are made either soluble or insoluble in a solvent known as a developer. When the exposed regions are soluble, a positive image of the mask is produced in the resist. When the nonexposed regions are soluble, a negative image results. After developing, the regions of the substrate no longer covered by the resist are removed by etching, thus replicating the mask pattern on the substrate.

In modern fabrication plants, wafers are formed from a number of identical dies, which each eventually become an integrated circuit. A "reticle" is a glass emulsion or chrome plate having an enlarged image of a single die. The photolithographic equipment steps and repeats the reticle across the wafer, with each step exposing one integrated circuit.

Many of today's integrated circuits have patterns that repeat, but whose repeating areas are too large to be contained on a single reticle. In other words, the size of the repeatable pattern exceeds the printable area of conventional lithographic equipment, so that the printing cannot be accomplished by stepping and repeating a single reticle. For example, a typical upper limit on reticle size is in the range of 22 millimeters square. Yet, for modern integrated circuits, it might be desired to have a repeatable pattern that exceeds this size.

Another problem with applying existing step and repeat processes is that many of today's circuits are so functionally sophisticated that a single chip may contain several types of circuits, which differ as to repeatability as compared to the other circuitry on the chip. For example, a memory device might have control circuitry as well as a memory cell array, with an overall pattern that repeats on a larger scale than the size of a single reticle.

One approach to exposing pattern sizes that exceed the size of a reticle is to use a "composition reticle". For example, a doubled pattern size can be accomplished if two reticles are used for the same layer, at two different times to step and repeat in alternating areas on the wafer surface. However, alignment of the two stepping processes is difficult and the processing time is increased.

A need exists for a fabrication process that facilitates photolithography for large and complex integrated circuits.

SUMMARY OF THE INVENTION

One aspect of the invention is a reticle for fabricating an integrated circuit on a wafer. As with conventional reticles, the reticle is formed by patterning opaque features on a transparent substrate. However, unlike conventional reticles, the reticle divides the circuit pattern into more than one mask. For example, the reticle might have one nonrepeating mask and one repeating mask. The nonrepeating mask is used once for exposing a first sub-pattern, while the repeating mask is blocked. Then, the nonrepeating mask is blocked and the repeating mask is used in a series of steps to expose a number of second sub-patterns.

A technical advantage of the invention is that alignment is a function of the accuracy of the step positioning capability of the lithographic equipment, without the added problem of aligning two different reticles. Typical lithographic step positioning is accurate within 0.02 to 0.03 micrometers, which is acceptable for today's circuit tolerances.

DETAILED DESCRIPTION OF THE INVENTION

Although the following description is in terms of fabricating an integrated circuit, the same description would be applicable to any other device made by photolithographic techniques. A common characteristic of such devices is that they require substantial precision in the formation of their components, and have a large array of repeating components. The "circuits" would be some other set of components. For example, liquid crystal display devices are made with photolithographic techniques, and could be made by using the reticle described herein.

Figure 1:
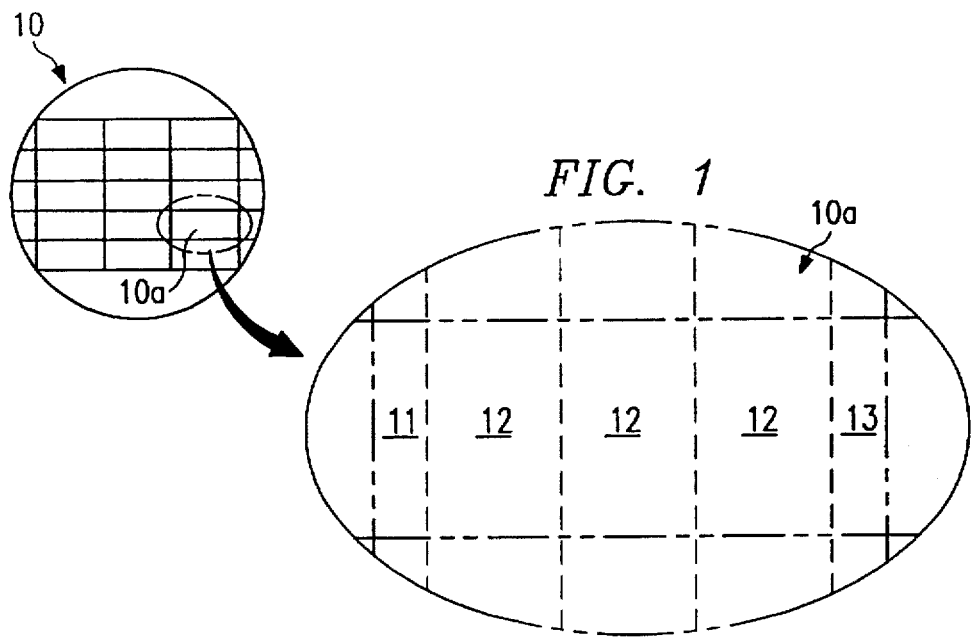
FIG. 1 is a top plan view of a fabrication layer of a semiconductor wafer, with components laid out in accordance with the invention.

FIG. 1 is a top plan view of a fabrication layer of a wafer 10, having a pattern of 15 dies, each of which will become an integrated circuit 10a, with components laid out in accordance with the invention. More specifically, the components of circuit 10a are laid out with three types of areas, each having a pattern with a different repeatability.

In the example of this description, the layer of wafer 10 has three different patterns. A first pattern is laid out in area 11, a second pattern in area 12, and a third pattern in area 13. The first and third areas 11 and 13 have nonrepeating patterns; the second area 12 has a number of repeating patterns.

In terms of the circuits that the patterns represent, peripheral subcircuits 11 and 13 are laid out at both ends, and individually comprise a left peripheral subcircuit 11 and a right peripheral subcircuit 13. These circuits have nonrepeating patterns, in the sense that each appears only once. Repeatable subcircuits 12 comprise the middle portion of the layer of circuit 10a. Repeatable subcircuits 12 are contiguous, have equal size, and are internally identical to each other. In the example of this description, circuit 10a has three repeatable subcircuits 12.

Typical components that might be patterned within left and right peripheral subcircuits 11 and 13 are address circuitry, built-in self test circuitry, clock counters, and control logic. Typical components that might be patterned within each repeatable subcircuit 12 are logic gate arrays and memory cell arrays.

Figure 2:
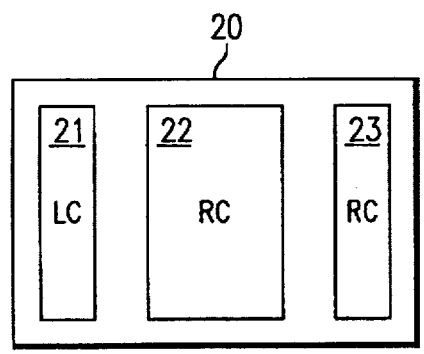
FIG. 2 is a top plan view of a reticle having separate mask areas in accordance with the invention.

FIG. 2 is a top plan view of a reticle 20, having separate masks 21–23 in accordance with the invention. As in conventional reticles, reticle 20 is patterned from a substrate of transparent material, such as glass. The patterning of each mask 21–23 is accomplished by conventional methods, resulting in each mask 21–23 having its own unique pattern of opaque and transparent features, that either block or transmit light to transfer the same pattern to the surface of a wafer.

A left mask 21 contains the pattern for left peripheral subcircuit 11. A repeatable mask 22 contains the pattern for each repeatable subcircuit 12. A right mask 23 contains the pattern for right peripheral subcircuit 13.

Although FIG. 2 shows the arrangement of mask areas 21–23, relative to each other, as being the same as the arrangement of their corresponding patterns on wafer 10, they could be arranged otherwise. For example, reticle 20 might have left mask 21, then right mask 23, then repeatable unit mask 22, in that order, from left to right.

The depiction of masks 21 and 23 as nonrepeating and mask 22 as repeating is for example only. More than one of masks 21–23 could be repeating. As explained below, the important characteristic of reticle 20 is that it has different masks for different patterns having different repeatability, such that during exposure, all masks other than a selected mask can be blocked and only the selected mask used for exposing the wafer 10 in a series of contiguous steps. This blocking is easily accomplished by using shuttering features available on conventional lithographic equipment.

FIGS. 1 and 2 illustrate two nonrepeating patterns 11 and 13 and their corresponding masks 21 and 23 at the left and right peripheries of the circuit. 10a. However, the same principles would apply if the nonrepeating patterns were at the top or bottom of the circuit 10a.

In operation, reticle 20 is used to expose all areas of a layer on wafer 10. For each die, reticle 20 is first placed at an initial position to expose the left peripheral subcircuit 11 with the left mask 21. At this time, only the left mask 21 transmits light to expose the surface of wafer 10; masks 22 and 23 are shuttered off or otherwise blocked so that they do not transmit light.

Then, reticle 20 is stepped, relative to the surface of wafer 10, an appropriate distance to the right, and blocked so that only mask 22 transmits light to wafer 10. Reticle 20 is illuminated and stepped a number of times to expose a first repeatable subcircuit 12, then a second repeatable circuit 12, etc., for as many times as required to expose an entire array of repeatable subcircuits 12 on wafer 10. Finally, the reticle 20 is stepped into position to expose the right peripheral subcircuit 13 with the right mask 23. The stepping of the above process differs from that of conventional step and repeat processes in that each stepping movement is in accordance with the mask size rather than the reticle size.

The above description is in terms of a single die, i.e., a portion of wafer 10 that will result in a single integrated circuit device. The same process is repeated for each die on the wafer 10.

Figure 3:
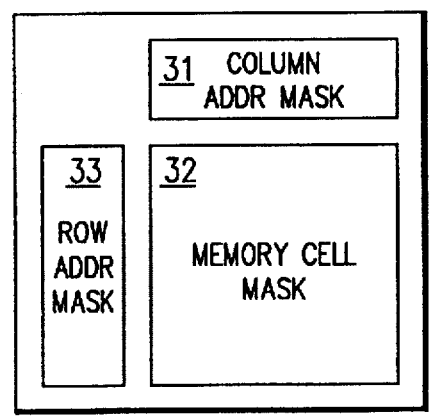
FIG. 3 illustrates a reticle for a memory device.

FIG. 3 illustrates a reticle 30 for exposing layers of a memory device, fabricated as an integrated circuit. Column addressing subcircuitry and row addressing subcircuitry are represented in the patterns of top mask 31 and left mask 33, respectively. The memory cell array is formed by stepping and repeating a repeatable memory cell mask 42, whose pattern represents a unit of one or more memory cells.

Figure 4:
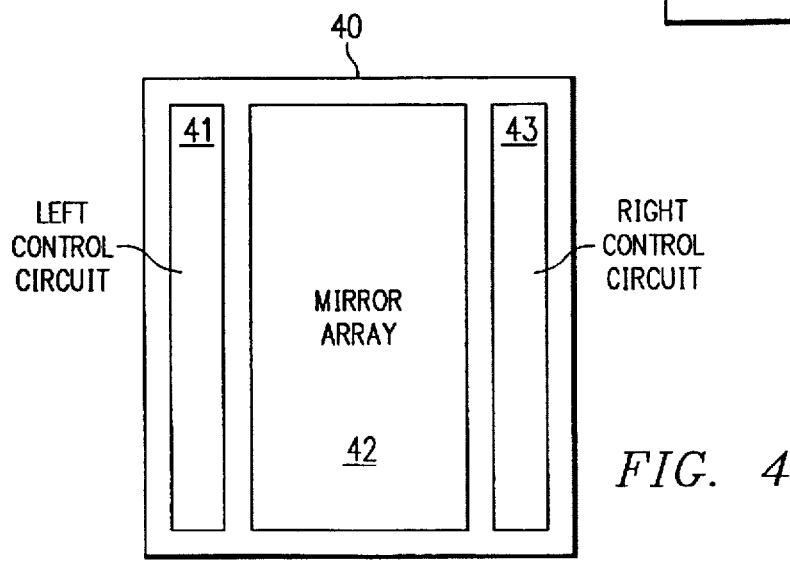
FIG. 4 illustrates a reticle for a deformable mirror device.

FIG. 4 illustrates a reticle 40 for exposing layers of a deformable mirror device (DMD), another device whose manufacture is especially made easier by the invention. In general, DMDs are a type of spatial light modulator having an array of pixel elements, which are tiny micro-mechanical mirrors. The pixel elements are individually addressable, such that each can be selectively positioned to direct light in either an "on" or "off" position. An addressed array of pixel elements represents an image frame, with the image being formed as a result of which pixel elements direct light to the image plane. The image can be captured by means of opto-electrical devices and used to generate a display or printed copy.

Typically, the pixel elements of a DMD have associated memory cells for storing the binary signal that will drive the pixel element to its on or off position. An advantage of many DMD designs is that the pixel array, as well as the memory cells and addressing circuits can be fabricated with integrated circuit techniques.

As the resolution provided by the DMD increases, so does the number of pixel elements in the pixel element array. Because of the large number of pixel elements, the overall size of the DMD may easily exceed the maximum reticle size for patterning with conventional photolithographic equipment. For example, a high resolution DMD for display or printing applications might have a length in the order of 3 or 4 inches.

FIG. 4 illustrates masks 41–43 for a DMD is laid out with left and right peripheral circuits as in FIG. 1. U.S. patent Ser. No. 07/678,761, entitled "DMD Architecture and Timing for Use in a Pulse-Width Modulated Display System", describes a DMD device having circuitry that may be laid out in this manner, and is incorporated herein by reference.

Masks 41–43 accommodate large DMDs by permitting fabrication in accordance with the invention. Left mask 41 and right mask 43 contain row address circuitry and control logic. The repeatable mask 42 contains subarrays of patterns for the pixel elements. These masks 41–43 are positioned and illuminated in the manner described above in connection with FIGS. 1 and 2.

For fabricating a linear DMD array, additional components, such as input registers could be included in the repeatable mask 42. For a square array, these input registers could be fabricated with upper and lower masks, as in FIG. 3, in addition to masks 41–43.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A reticle for exposing a layer of a device made by photolithographic techniques, comprising:

a transparent substrate;

a nonrepeating mask on said substrate, having a first pattern for exposing a nonrepeating set of components; and a repeating mask patterned on said substrate, having a second pattern for exposing a contiguously stepped set of repeating components, wherein said nonrepeating set of components is contiguous with and allows connection between itself and at least one of said set of repeating components on one chip.

2. The reticle of claim 1, wherein said nonrepeating mask represents a set of components in a perimeter of the device.

3. The reticle of claim 1, wherein said repeating mask represents a portion of an array of identical components in the center of the device.

4. A reticle for exposing at least one layer of a semiconductor wafer, comprising:

a transparent substrate;

a nonrepeating mask patterned on said substrate, having a first pattern for exposing a nonrepeating subcircuit; and a repeating mask patterned on said substrate, having a second pattern for exposing a contiguously stepped set of repeating subcircuits on the center portion of said wafer, wherein said nonrepeating subcircuit is contiguous with and allows connection between itself and at least one of said set of repeating subcircuits on one chip.

5. The reticle of claim 4, wherein said nonrepeating mask has pattern that represents peripheral control subcircuitry at a perimeter of the integrated circuit.

6. The reticle of claim 4, and further comprising an another nonrepeating mask on said substrate, having a third pattern for exposing another subcircuit pattern at a perimeter of the integrated circuit.

7. The reticle of claim 6, wherein said nonrepeating masks are on opposing sides of the integrated circuit.

8. The reticle of claim 6, wherein said nonrepeating masks are on adjacent sides of the integrated circuit.

9. The method of claim 8, wherein said blocking step is performed with shuttering devices of photolithographic equipment.

10. The reticle of claim 4, wherein said repeating mask has a pattern that represents memory cells.

11. The reticle of claim 4, wherein said repeating mask has a pattern that represents deformable mirror pixel elements.

12. A method of exposing wafers made with photolithographic stepper equipment, for devices having an array of repeating components whose repeatability exceeds the stepping increments of the photolithographic equipment, comprising the steps of:

patterning the device into subareas, wherein a nonrepeating pattern is laid out in a perimeter area of the device and a repeating pattern is laid out in a center area of the device;

fabricating a lithographic reticle for said nonrepeating and repeating patterns, such that a single reticle has a nonrepeating mask and a repeating mask;

blocking said repeating mask area such that only said nonrepeating mask area transmits light to said perimeter area;

illuminating said reticle to expose the surface of said device with the pattern of said nonrepeating mask;

moving said reticle to expose a portion of said center area;

blocking said nonrepeating mask such that only said repeating mask transmits radiation; and stepping said repeating mask a number of times, to expose a number of contiguous repeating patterns in said center area.

\* \* \* \* \*